United States Patent [19]

Cannella et al.

[11] Patent Number: 4,547,789
[45] Date of Patent: Oct. 15, 1985

[54] HIGH CURRENT THIN FILM TRANSISTOR

[75] Inventors: Vincent D. Cannella, Detroit; Gregory L. Hansell, Ann Arbor, both of Mich.; Zvi Yaniv, Beer-Sheva, Israel; Meera Vijan, Troy, Mich.

[73] Assignee: Energy Conversion Devices, Inc., Troy, Mich.

[21] Appl. No.: 549,978

[22] Filed: Nov. 8, 1983

[51] Int. Cl.[4] .......................................... H01L 29/78
[52] U.S. Cl. ..................................... 357/23.7; 357/2; 357/4; 357/23.4; 357/23.1; 357/41
[58] Field of Search .................... 357/23.7, 2, 4, 23.4, 357/23.1, 41

[56] References Cited

U.S. PATENT DOCUMENTS

| | | | |
|---|---|---|---|
| 3,293,512 | 12/1966 | Simmons et al. | 357/4 |
| 3,304,469 | 2/1967 | Weimer | 357/23.7 |
| 3,313,988 | 4/1967 | Drumheller | 357/23.7 |
| 3,384,792 | 5/1968 | Kazan et al. | 357/41 |
| 3,493,812 | 2/1970 | Weimer | 357/4 |
| 3,500,142 | 3/1970 | Kahng | 357/41 |
| 3,669,661 | 6/1972 | Page et al. | 357/23.7 |
| 4,203,123 | 5/1980 | Shanks | 357/2 |
| 4,291,318 | 9/1981 | Sansregret | 357/2 |
| 4,441,973 | 4/1984 | Noguchi | 357/4 |
| 4,471,371 | 9/1984 | Hamano | 357/2 |

FOREIGN PATENT DOCUMENTS 2052853  1/1981  United Kingdom .............. 357/23.4
2067353  7/1981  United Kingdom .............. 357/23.7

Primary Examiner—Andrew J. James
Assistant Examiner—Lamarr A. Brown
Attorney, Agent, or Firm—Marvin S. Siskind

[57] ABSTRACT

A new and improved thin film field effect transistor has increased operating current and speed. The transistor includes a drain, an insulator, and a source formed in layers and vertically arranged with respect to a substrate and each other. The drain, however, and source layers form a plurality of non-coplanar surfaces with respect to the substrate. The device further includes a deposited semiconductor material overlying the non-coplanar surfaces to form a plurality of current conduction channels between the drain and source. A gate insulator overlies the semiconductor material, and a gate electrode overlies the gate insulator. The devices can also include carrier injection structure including a doped semiconductor material electrically coupled to the drain, the source, and the deposited semiconductor material for increasing the injection of current conduction carriers in the current conduction channels.

41 Claims, 2 Drawing Figures

HIGH CURRENT THIN FILM TRANSISTOR

BACKGROUND OF THE INVENTION

1. Field of the Invention

The present invention relates to high current thin film field effect transistors which are of small area and which can be operated at high speed and provide high output currents. The invention more particularly relates to thin film field effect transistors having a plurality of current conduction channels or paths within the semiconductor material between the source and drain regions to provide increased output currents.

2. Description of the Prior Art

Thin film field effect transistors generally comprise source and drain electrodes interconnected by a semiconductor material. Conduction between the electrodes takes place primarily within the semiconductor. The current flow between the electrodes is controlled by the application of a voltage to a gate which is adjacent at least a portion of the semiconductor and is insulated therefrom.

There are many applications wherein it is desirable to have a thin film field effect transistor capable of providing relatively high output currents and operating at relatively high speeds. One such application is in large area liquid crystal displays wherein the transistors are called upon to drive the individual pixels of the displays. The current required to drive these displays is directly related to the display area while the required device speed is directly related to the number of pixels forming the display.

In thin film field effect transistors, the device output current and operating speed are largely dependent upon the length of the current conduction channel between the source and drain. More particularly, the output current is inversely proportional to the channel length and the operating frequency is inversely proportional to the square of the channel length. Hence, if the channel length of a device can be reduced from 10 microns to 1 micron, the output current could be increased ten times and the operating speed could be increased one hundred times. In addition, if the channel length could be decreased as above, the width of the device could be decreased. For example, typical planar thin film field effect transistors have a channel length of 10 microns, a width of about 500 microns and provide output current of about 10 microamps. If the channel length of that device could be reduced to one micron, that same 10 microamps of current could be provided by a device only 50 microns wide. Hence, the total area of the device could be reduced by a factor of ten and thus the packing density could be increased by a factor of ten. By reducing the device area by one-tenth, the capacitance of the device can also be reduced by a factor of ten. Further, the resulting device, while providing the same current and occupying one-tenth the area, could also exhibit an operating frequency one hundred times higher than the original thin film field effect transistors having the ten micron channel.

Unfortunately, the channel length in conventional thin film field effect transistors cannot be readily reduced from the standard channel length of ten microns to a channel length of one micron. The reason for this is that the channel length is determined by the spacing between the drain and source electrodes. Conventional large area photolithography, the process by which the device structures are formed across 12 inch distances, has a feature size of ten microns. Hence, with conventional photolithography as used for large areas, the minimum channel length obtainable is ten microns.

More precise photolithography having feature sizes down to about one micron are known. However, this precision process is difficult to perform and the equipment necessary to practice it is extremely expensive. In addition, the one micron feature size cannot be maintained over large areas. As a result, while channel lengths in conventional thin film field effect transistors can be reduced to about one micron in the laboratory, it is expensive and cannot be provided over large areas such as is required in large area liquid crystal flat panel displays. This makes precision photolithography virtually useless in commercial applications such as liquid crystal flat panel display where one hundred percent yield over large areas is essential.

To overcome these deficiencies in prior art thin film field effect transistor structures, a new and improved thin film field effect transistor has been proposed. This improved transistor is disclosed and claimed in commonly assigned copending U.S. Patent application Ser. No. 529,299 for Thin Film Transistor filed in the names of Richard A. Flasck, et al. The transistor therein disclosed includes source and drain regions vertically displaced with respect to each other relative to a substrate and having a channel formed therebetween, the length of which is a function of the vertical displacement distance between the source and drain and which is substantially independent of the constraints otherwise imposed by horizontal lithography. A further improvement of this transistor is disclosed and claimed in copending U.S. Patent application Ser. No. 549,996, filed concurrently herewith, for High Performance, Small Area, Thin Film Transistor which is assigned to the assignee of the instant invention. The transistor there disclosed includes a drain region, a source region, a gate electrode, a gate insulator, and a deposited semiconductor material. The drain and source region are vertically arrayed with respect to a substrate, have an insulating layer therebetween, and form a non-coplanar surface with respect to the substrate. As defined in that application, a noncoplanar surface is meant to be a surface which defines a plane which is non-parallel with respect to the substrate although it may include minor surface portions which are parallel to the substrate. The deposited semiconductor material which is preferably an amorphous silicon alloy overlies the non-coplanar surface to form a current conduction channel or path between the drain and source regions. The gate electrode insulator overlies the deposited semiconductor and the gate electrode overlies at least a portion of the gate insulator adjacent to the current conduction channel.

These improved transistor structures exhibit many advantages. Because the thickness of the layer between the source and drain determines the current conduction channel length through the semiconductor, the channel length can be accurately controlled without precision and time consuming photolithography techniques. As a result, short channel lengths are possible providing high current and high speed operation of the device. Further, the accurate control of the short channel lengths can be maintained over large areas for applications such as liquid crystal displays where high yield is essential and where high precision photolithography fails.

While the transistors described above have many advantages, a further improvement is disclosed and claimed in copending U.S. patent application Ser. No. 550,234, filed concurrently herewith for High Performance Thin Film Transistor Having Improved Carrier Injection and which is assigned to the assignee of the present invention. As described in that application, the drain and source regions are each formed from a layer of a metal, such as molybdenum for example, and an n-type semiconductor layer. The n-type semiconductor layer increases the carrier injection capability of the device so that higher currents from the device can be obtained for a given source to drain voltage. The increase in the carrier injection into the current conduction channel allows the advantages afforded by the device structure to be more fully realized.

The present invention provides a further improvement to these devices. More specifically, the present invention provides a new thin film transistor structure having a plurality of current conduction channels or paths. The channels are short and share a common source, drain, and gate so that a further increase in output current can be realized. Further, this increase in current is obtained without a proportionate increase in device capacitance. Hence, the thin film transistors of the present invention not only provide increased currents, but in addition, provide increased speed as well.

SUMMARY OF THE INVENTION

The invention provides a thin film field effect transistor of the type including a substrate, a drain region, a source region, a gate insulator and a gate electrode.

A plurality of layers of deposited material form the drain region, the source region, the gate insulator, and the gate electrode. At least some of the layers are vertically arrayed with respect to the substrate and to each other and form on the substrate the drain region and the source region. The drain region and source region layers have edges, portions of which form a plurality of non-horizontal surfaces, i.e., non-coplanar surfaces, with respect to the substrate. A deposited semiconductor material overlies at least the non-coplanar surfaces and is electrically coupled to the drain region and the source region to form a plurality of current conduction channels or paths therebetween. The gate insulator is disposed over the semiconductor layer and separates the gate electrode from the semiconductor material layer. In accordance with one embodiment, carrier injection means are electrically coupled to the drain region, the source region, and the semiconductor material for providing a good ohmic contact between the semiconductor material and the source and drain regions.

Also, in accordance with the invention, an insulating layer is disposed between the drain and source region layers. The drain region layers, the insulating layer, and the source region layers are arrayed vertically with respect to the substrate and have edges, portions of which form the non-coplanar surfaces. The carrier injection means can include a first layer of semiconductor material adjacent the drain region layer and a second layer of semiconductor material adjacent the source region layer.

The deposited semiconductor preferably includes silicon. It can be polycrystalline or preferably an amorphous silicon alloy. It can further be a germanium alloy.

The semiconductor layers forming the carrier injection means are preferably doped n-type or p-type and can be either polycrystalline or amorphous semiconductors. Preferably, the doped semiconductor layers are formed from an amorphous silicon alloy including phosphorus and fluorine. Also in accordance with the present invention, the doped semiconductor and its associated region layer nearer to the substrate project laterally from the insulating layer towards the deposited semiconductor for making broad area contact with the current conduction channels.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings, in the several figures of which like reference numbers identify identical elements and wherein:

DESCRIPTION OF THE PREFERRED EMBODIMENTS

Figure 1:
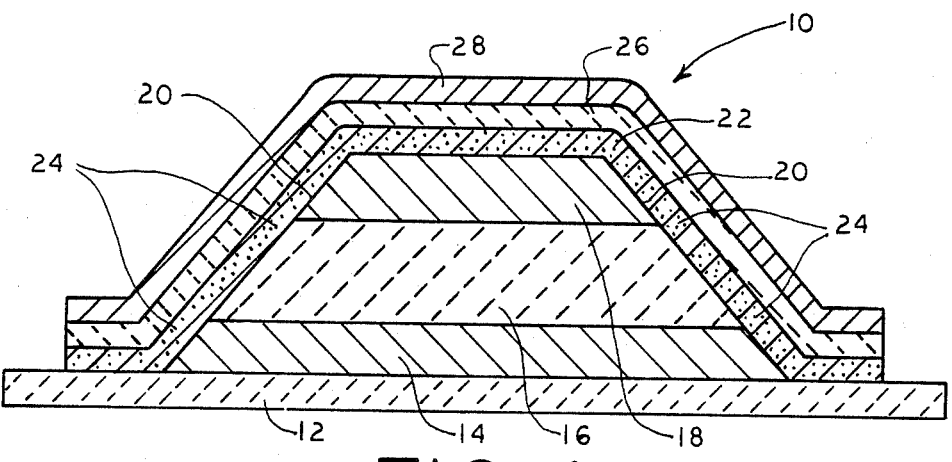
FIG. 1 is a cross-sectional side view of a thin film, field effect transistor embodying the present invention.

Referring now to FIG. 1, it illustrates a thin film field effect transistor 10 embodying the present invention. As shown, the transistor 10 is formed on a substrate 12 of insulating material which could be glass, single crystalline silicon, mylar, or an insulator on top of a metal, such as a dielectric overlying a stainless steel surface. Deposited on the substrate 12 is a layer 14 of drain metal. On top of drain metal layer 14 is a layer 16 of insulating material. The insulating material is preferably of a dielectric material. The dielectric material can be silicon oxide ($SiO_x$), silicon nitride ($Si_xN_y$), silicon oxynitride ($SiO_xN_y$) or aluminum oxide ($Al_2O_3$).

A source layer 18 made of a metal is deposited over the insulative layer 16. The source metal 18 and drain metal 14 can be formed of any suitable conductive metal, such as aluminum, molybdenum or molybdenum tantalum alloy such as $Mo_{0.975}Ta_{0.025}$). Other suitable metals are chrome, titanium tungsten (TiW), palladium and platinum. Once layers 14, 16 and 18 have been deposited, all of the layers can be etched in one continuous step as fully disclosed in copending U.S. patent application Ser. No. 549,991, filed concurrently herewith for Method Of Making A High Performance, Small Area Thin Film Transistor to form a plurality of non-coplanar surfaces 20. The non-coplanar or diagonal surfaces 20 are defined by the exposed portions of the source layer 18, the insulative layer 16, and the drain layer 14. As used herein, a non-coplanar surface is meant to be a surface which defines one or more planes which are non-parallel with respect to the substrate although it may include minor plane portions which are parallel to the substrate.

A layer of semiconductor material 22 between 100 and 10,000Å and preferably 2,000Å in thickness is deposited over the non-coplanar surfaces 20 and source layer 18. The semiconductor material is preferably an amorphous silicon alloy including hydrogen, or fluorine, or hydrogen and fluorine. The deposited semiconductor material can also be a polycrystalline silicon alloy or an amorphous or polycrystalline germanium alloy as well. The semiconductor material 22 is electrically coupled to the source 18 and drain 14. Because it is deposited over separate non-coplanar surfaces, a plurality of short current conduction channels or paths 24 result in the semiconductor material layer 22 between source layer 18 and drain layer 14. A gate insulator layer 26 of insulating material is then deposited over a portion of the amorphous semiconductor material layer 22. The gate insulator is preferably a dielectric such as silicon oxide or silicon nitride.

On the gate insulator layer 26 is deposited a gate electrode or conductor 28 which can be made of any suitable metal such as aluminum, molybdenum, chrome or molybdenum tantalum alloy, for example. The gate electrode 28 is formed over a portion of the gate insulator 26 and adjacent to the semiconducting channel 24. A passivating layer (not shown) made of an oxide or polymer can finally be formed over the device. The source metal 18 and the drain metal 14 can typically have thicknesses ranging from 1,000 to 3,000Å, with the thickness preferably being 2,500Å. The insulative layer 16 can typically have a thickness between 0.5 to 3 microns, preferably 1.5 microns, and the gate insulator layer 26 can typically have a thickness of between 3,000 to 5,000Å, and preferably 2,000Å.

The transistor 10 of FIG. 1 can be made in accordance with the inventive method disclosed and claimed in the aforementioned copending U.S. patent application Ser. No. 549,991, filed concurrently herewith for Method of Making a High Performance, Small Area Thin Film Transistor, which application is also assigned to the assignee of the present invention.

As disclosed in the aforementioned copending U.S. patent application Ser. No. 549,991, the drain layer 14 preferably made of molybdenum, the insulative layer 16 preferably made of silicon oxide, and the source layer 18 preferably made of molybdenum are first deposited onto the glass substrate 12. The drain and source layers are deposited by sputtering and the insulating layer is deposited by plasma assisted chemical vapor deposition. The drain and the source layers preferably have thicknesses of 2,500Å and the insulative layer preferably has a thickness of about 0.8 microns.

A layer of positive photoresist having a thickness of about 3 to 3.5 microns is then deposited over the source layer 18. The positive photoresist can be deposited by using a spin coating method and the positive photoresist is, for example, Shipley's p-type AZ 1350J. A mask is placed over a portion of the positive photoresist layer. The unmasked portions can then be exposed to a collimated light source having an intensity of 300 millijoules/cm$^2$ for a period of 16 seconds, underexposing the photoresist by about 20% since the normal intensity of exposure is 360 millijoules/cm$^2$ for 16 seconds.

Also as disclosed in the aforementioned copending U.S. patent application Ser. No. 549,991, after exposure, the mask is removed and the positive photoresist layer is actively developed. For example, one part of Shipley developer AZ-311 is used along with three parts water to create an active developer solution. Only the exposed portions of the positive photoresist layer are soluble to the active developer solution. As also disclosed in the aforementioned copending U.S. patent application Ser. No. 549,991, the photoresist can be underexposed and overdeveloped whereby to form a diagonal or tapered structure.

After developing the positive photoresist layer, tapered surfaces result on a portion of the photoresist layer. The tapered surfaces will serve as a mask for the three layers below the positive photoresist layer when the device is subjected to a plasma etching process. After plasma etching, a plurality of non-coplanar surfaces 20 which are diagonal with respect to the substrate 12 are formed.

The photoresist layer, the drain layer 14, the insulating layer 16, and the source layer 18 are then subjected to the plasma etching for a period of 10 to 12 minutes. Any positive photoresist remaining after this process is removed in order to allow for proper deposition of other layers above the etched surface.

The layer of semiconductor material 22 is then formed by plasma assisted chemical vapor deposition at least over the non-coplanar surfaces 20 and the top surface of the source layer 18. The purpose of the following steps is to form the semiconductor layer 22 so that it covers the non-coplanar surfaces 20 and the source layer 18 of the device.

The gate insulator layer 26 is then deposited over the entire device including the amorphous semiconductor material layer 22 and the gate electrode 28 and is then formed over the device. The semiconductor material layer 22, the gate insulator 26, and the gate electrode 20 are then etched together in a one mask exposure, single etch conventional process.

The device 10 which results from the foregoing process, as previously mentioned, includes a plurality of current conduction channels or paths 24. More specifically as illustrated in FIG. 1, the device 10 includes a pair of current conduction channels 24 which are opposed to one another and share the drain 14 and source 18 in common. As a result, the device 10 is capable of providing twice the output current of a similar device having a single current conduction channel.

Not only does the device 10 provide twice the current, but in addition, it does so while exhibiting less than twice the capacitance so that faster operating speeds are also possible. In a device of this construction, the main part of the device capacitance appears from the gate 28 to the source 18 and the source 18 to the drain 14. These portions of the device represent the largest parallel conductive surface areas of the device separated by insulating layers. The surface areas are a result of the lithographic feature size which is obtainable. Since this feature size must be tolerated even in a device having a single current conduction channel, the addition of an additional current conductive channel can be obtained without increasing the areas of these portions. As a result, the additional current conduction channels can be formed without appreciably increasing the capacitance of the device. Hence, a device results having at least twice the output current capacity but having substantially less than twice the capacitance. As a result, the devices of the present invention can be operated at significantly higher frequencies than heretofore obtainable with single channel devices.

In addition to these significant advantages, the length of the current conduction channels can still be made short and precisely controlled with precision photolithographic techniques. More specifically, these devices retain the advantage of precise channel length control through the control of the thickness of the deposited insulating layer 16.

Figure 2:
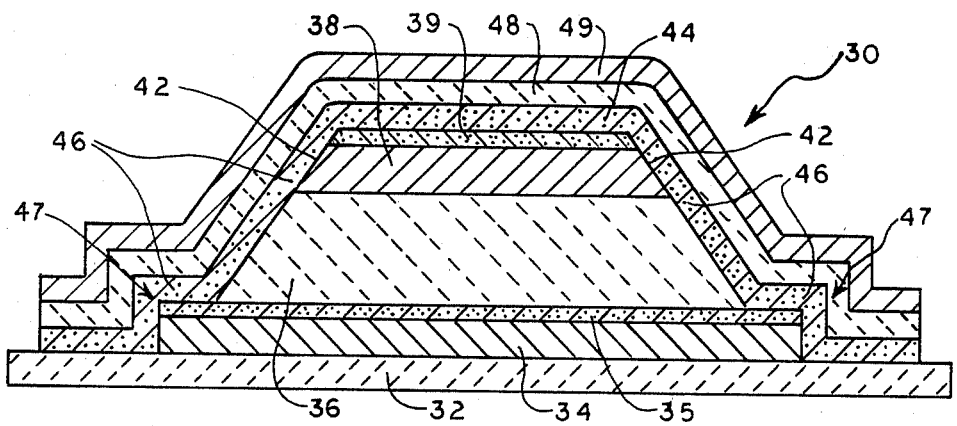
FIG. 2 is a cross-sectional side view of another thin film, field effect transistor embodying the present invention.

In FIG. 2 there is illustrated another thin film, field effect transistor 30 embodying the present invention. On an insulating substrate 32 is first deposited a layer of drain metal 34. On top of the drain metal 34 is deposited a layer 35 of doped, n+ type amorphous silicon alloy and a layer 36 of insulative material. On top of the insulative layer 36 is formed a layer of source metal 38 and another doped n+ type amorphous silicon alloy layer 39. Once layers 34, 35, 36, 38 and 39 have been deposited, the non-coplanar surfaces 42 with respect to substrate 32 are formed.

After forming surfaces 42, a layer of semiconductor material 44 is formed over the surface 42 and over the second doped semiconductor layer 39. A plurality of thin, short semiconducting channels 46 result in the semiconductor material layer 44 between the drain layer 34 and layer 35 and the source layer 38 and layer 39. A gate insulator layer 48 is then formed over the semiconductor material 44. Finally, a gate electrode 49 is formed over the gate insulator layer 48.

The doped semiconductor layers 35 and 39 preferably have a thickness of 200Å to 1500Å and preferably 1000Å. The layers 35 and 39 are further preferably formed from amorphous silicon alloys including phosphorus and hydrogen or fluorine or hydrogen and fluorine and can be polycrystalline as well. The alloys including fluorine are preferred because they have been shown to exhibit very high conductivity. The doped layers 35 and 39 serve as carrier injection means for providing a good or improved ohmic contact between the drain 34 and source 38 and the deposited amorphous silicon alloy 44. As can be noted in FIG. 2, the layers 35 and 39 are in contact with the drain 15 and source 38 respectively and in contact with the amorphous silicon alloy 44. These layers provide an enhanced ohmic contact between their associated drain or source region over that obtainable with the metal layers alone. This results because the doped semiconductors have more available carriers than the metal, and therefore provide more efficient carrier injection into the amorphous silicon. As a result, the carrier injection means including the doped semiconductor layers 35 and 39 provide a device having increased current output for a given source to drain voltage and faster operating speeds. It can also be noted that the doped layer 35 is disposed between the drain region layer 34 and the insulating layer 36 and that the doped layer 39 is disposed between the source region layer 38 and the deposited semiconductor 44. As disclosed in the aforementioned U.S. patent application Ser. No. 550,234, the relative position of the doped layers can be varied and different device structures are possible.

It can be noted in FIG. 2 that the drain layer 34 and doped n+ type semicondcutor layer 35 project laterally from or beyond the insulating layer 36 towards the deposited semiconductor 44. This provides portions 47 which form broad surface contact between the carrier injecting n+ type semiconductor 35 and the deposited semiconductor 44. As a result, the ohmic contact between these layers is enhanced because the carrier injection is rendered more efficient. The portions 47 can be formed by terminating the plasma etch when the layer 35 is reached by the plasma.

Also, as can be further noted, because the n+ type semiconductor layer 39 is on top of the source metal, it also makes broad surface contact with the deposited semiconductor 44. Hence, the ohmic contact between these layers is also enhanced because the carrier injection is also made more efficient.

The thin film, field effect transistor 30 of FIG. 2 can also include a top passivating layer formed from a field oxide. The top passivating or insulating layer can be utilized to form an insulating layer for another transistor to be formed thereon to provide a stacked transistor configuration to increase the packing density of the devices.

The present invention provides new and improved thin film field effect transistor structures which can operate at high currents and high operating speeds. These characteristics result by virtue of the plurality of current conduction channels and the enhanced carrier injection and ohmic contact between the drain and source electrodes and the current conduction channels of the devices. In addition, the present invention can be practiced with many different device configurations. Also, the devices are, for example, symmetrical in that the source and drain designations can be reversed for each device. Further, while amorphous silicon alloys are preferred for the deposited semiconductor and the n+ semiconductor layers, polycrystalline materials can also be used. In addition, p-type semiconductors can be used in substitution for the n+ type semiconductors forming the carrier injection means. In this case, the polarity of the device is reversed and the deposited semiconductor material should be doped slightly p-type so that holes will be the majority carriers in the current conduction channels. P-type semiconductor material can be made by adding a p-type dopant gas such as diborane ($B_2H_6$) to the plasma deposition environment during the deposition of the deposited semiconductor. P-type carrier injection semiconductor layers can be made by, for example, substituting diborane gas for the phosphine gas during the deposition thereof.

It is therefore to be understood that within the scope of the appended claims the invention can be practiced otherwise than as specifically described.

What is claimed and desired to be secured by Letters Patent of the United States is:

1. A thin film field effect transistor of the type formed on a substantially planar substrate, said transistor comprising:

a plurality of layers, said plurality of layers being contiguous and formed over said substrate to form a drain region layer, a source region layer and an electrically insulating layer between said source and drain region layers;

said plurality of layers having edge portions forming a plurality of surfaces which are non-parallel to said substrate;

a deposited semiconductor material layer overlying said non-parallel surfaces and electrically coupled to said drain region layer and said source region layer along said non-parallel surfaces for forming a plurality of current conduction channels therebetween;

a gate insulator disposed over said deposited semiconductor material layer; and a gate electrode separated from said deposited semiconductor material layer by said gate insulator.

2. A thin film field effect transistor as defined in claim 1 wherein said plurality of non-parallel surfaces comprise a pair of non-parallel surfaces.

3. A thin film field effect transistor as defined in claim 2 wherein said pair of non-parallel surfaces are opposite one another.

4. A thin film field effect transistor as defined in claim 1 wherein said plurality of non-parallel surfaces comprise diagonal surfaces with respect to said substrate.

5. The thin film field effect transistor as defined in claim 1 wherein said deposited semiconductor material layer includes silicon.

6. The thin film field effect transistor as defined in claim 5 wherein said deposited semiconductor material layer is an amorphous silicon alloy.

7. The thin film effect transistor as defined in claim 6 wherein said amorphous silicon alloy includes hydrogen.

8. The thin film field effect transistor as defined in claim 6 wherein said amorphous silicon alloy includes fluorine.

9. The thin film field effect transistor as defined in claim 6 wherein said amorphous silicon alloy includes fluorine and hydrogen.

10. The thin film field effect transistor as defined in claim 1 further including carrier injection means electrically coupled to said drain region, said source region, and said semiconductor material for injecting current conduction carriers into said current conduction channels between said source region layer and said drain region layer.

11. The thin film field effect transistor as defined in claim 10 wherein said carrier injection means comprises a first layer of semiconductor material adjacent said drain region layer and a second layer of semiconductor material adjacent said source region layer.

12. The thin film field effect transistor as defined in claim 11 wherein said first and second layers of semiconductor material are formed from a doped semiconductor material.

13. The thin film field effect transistor as defined in claim 12 wherein said doped semiconductor material is n-type.

14. The thin film field effect transistor as defined in claim 12 wherein said doped semiconductor is p-type.

15. The thin film field effect transistor as defined in claim 12 wherein said doped semiconductor material comprises a doped amorphous silicon alloy.

16. The thin film field effect transistor as defined in claim 15 wherein said doped amorphous silicon alloy is n-type.

17. The thin film field effect transistor as defined in claim 16 wherein said n-type amorphous silicon alloy includes fluorine.

18. The thin film field effect transistor as defined in claim 16 wherein said n-type amorphous silicon alloy includes hydrogen.

19. The thin film field effect transistor as defined in claim 16 wherein said n-type amorphous silicon alloy includes fluorine and hydrogen.

20. The thin film field effect transistor as defined in claim 16 wherein said n-type amorphous silicon alloy includes phosphorous.

21. The thin film field effect transistor as defined in claim 15 wherein said doped amorphous silicon alloy is p-type.

22. The thin film field effect transistor as defined in claim 11 wherein said first layer of semiconductor material is disposed between said drain region layer and said insulating layer.

23. The thin film field effect transistor as defined in claim 11 wherein said second layer of semiconductor material is disposed on the side of said source region layer opposite said electrically insulating layer.

24. The thin film field effect transistor as defined in claim 11 wherein said drain region layer and said first layer of semiconductor material project laterally from said electrically insulating layer to facilitate broad surface contact with said deposited semiconductor material layer.

25. The thin film field effect transistor as defined in claim 1 wherein said electrically insulating layer is silicon oxide ($SiO_x$).

26. The thin film field effect transistor as defined in claim 1 wherein said drain and source region layers are formed from metal.

27. The thin film field effect transistor as defined in claim 26 wherein said metal is molybdenum.

28. A thin film field effect transistor of the type including a substrate, said transistor comprising:
a plurality of layers of deposited material, said layers being contiguous and forming a drain region layer, a source region layer and an electrically insulating layer between said drain and source region layers;
said drain region layer, source region layer, and electrically insulating layer forming a plurality of adjacently extending surfaces which are non-parallel to said substrate;
a plurality of regions of deposited semiconductor material extending over said adjacently extending non-parallel surfaces to form a plurality of field controlled current conducting paths between said source region layer and drain region layer;
a gate insulator overlying said regions of deposited semiconductor material; and
a gate electrode overlying said gate insulator.

29. A thin film field effect transistor as defined in claim 28 wherein said non-parallel surfaces comprise a pair of non-parallel surfaces.

30. A thin film field effect transistor as defined in claim 29 wherein said pair of non-parallel surfaces are opposite one another.

31. A thin film field effect transistor as defined in claim 28 wherein said non-parallel surfaces comprise diagonal surfaces with respect to said substrate.

32. The thin film field effect transistor as defined in claim 28 wherein said deposited semiconductor material includes silicon.

33. The thin film field effect transistor as defined in claim 32 wherein said deposited semiconductor material is an amorphous silicon alloy.

34. The thin film field effect transistor as defined in claim 33 wherein said amorphous silicon alloy includes hydrogen.

35. The thin film field effect transistor as defined in claim 33 wherein said amorphous silicon alloy includes fluorine.

36. The thin film field effect transistor as defined in claim 33 wherein said amorphous silicon alloy includes fluorine and hydrogen.

37. The thin film field effect transistor as defined in claim 28 further including carrier injection means electrically coupled to said drain region layer, said source region layer, and said deposited semiconductor material for injecting current conduction carriers into said current conduction paths between said source region layer and said drain region layer.

38. The thin film field effect transistor as defined in claim 37 wherein said carrier injection means comprises a first layer of semiconductor material adjacent said drain region layer and a second layer of semiconductor material adjacent said source region layer.

39. The thin film field effect transistor as defined in claim 38 wherein said first and second layers of semiconductor material are formed from a doped semiconductor material.

40. The thin film field effect transistor as defined in claim 39 wherein said doped semiconductor material is n-type.

41. The thin film field effect transistor as defined in claim 39 wherein said doped semiconductor material is p-type.

* * * * *

UNITED STATES PATENT AND TRADEMARK OFFICE
CERTIFICATE OF CORRECTION

PATENT NO. : 4,547,789

DATED : December 12, 1985

INVENTOR(S) : Vincent D. Cannella; Gregory L. Hansell; Zvi Yaniv and Meera Vijan It is certified that error appears in the above-identified patent and that said Letters Patent is hereby corrected as shown below:

Abstract, line 5, "however" should read --insulator--;

Column 7, line 48, "semicondctor" should read --semiconductor--;

Column 8, line 60, "clain" should read --claim--; and

Column 9, line 4, after "film" insert --field--.

Signed and Sealed this

Fourth Day of March 1986

[SEAL]

Attest:

Attesting Officer

DONALD J. QUIGG

Commissioner of Patents and Trademarks